US012435443B2

(12) United States Patent
Takanashi et al.

(10) Patent No.: US 12,435,443 B2
(45) Date of Patent: Oct. 7, 2025

(54) METHOD AND APPARATUS FOR MANUFACTURING DEFECT-FREE MONOCRYSTALLINE SILICON CRYSTAL

(71) Applicant: SUMCO Corporation, Tokyo (JP)

(72) Inventors: Keiichi Takanashi, Saga (JP); Ippei Shimozaki, Imari (JP)

(73) Assignee: SUMCO Corporation, Tokyo (JP)

( * ) Notice: Subject to any disclaimer, the term of this patent is extended or adjusted under 35 U.S.C. 154(b) by 415 days.

(21) Appl. No.: 18/117,981

(22) Filed: Mar. 6, 2023

(65) Prior Publication Data

US 2023/0228000 A1 Jul. 20, 2023

Related U.S. Application Data

(63) Continuation of application No. 17/037,060, filed on Sep. 29, 2020, now Pat. No. 11,618,971.

(51) Int. Cl.
*C30B 15/20* (2006.01)
*C30B 15/10* (2006.01)
*C30B 35/00* (2006.01)

(52) U.S. Cl.
CPC ............ *C30B 35/002* (2013.01); *C30B 15/10* (2013.01); *C30B 15/20* (2013.01)

(58) Field of Classification Search
CPC ........ C30B 15/10; C30B 15/20; C30B 35/002
See application file for complete search history.

(56) References Cited

U.S. PATENT DOCUMENTS 11,618,971 B2 * 4/2023 Takanashi ............... C30B 15/10 117/208
2006/0027160 A1 2/2006 Suzuki
(Continued)

FOREIGN PATENT DOCUMENTS

CN 107436306 A 12/2017
CN 109750352 A 5/2019
(Continued)

OTHER PUBLICATIONS

Taiwan IPO Examination Report issued Jun. 21, 2022, in corresponding Taiwanese Application No. 110135496, filed Sep. 24, 2021, 32 pages.
(Continued)

*Primary Examiner* — Matthew J Song
(74) *Attorney, Agent, or Firm* — Christensen O'Connor JJohnson Kindness PLLC

(57) ABSTRACT

A crystal puller apparatus comprises a pulling assembly to pull a crystal from a silicon melt at a pull speed; a crucible that contains the silicon melt; a heat shield above a surface of the silicon melt; a lifter to change a gap between the heat shield and the surface of the silicon melt; and one or more computing devices to determine an adjustment to the gap using a Pv-Pi margin, at a given length of the crystal, in response to a change in the pull speed. The computer-implemented method by a computing device comprises determining a pull-speed command signal to control a diameter of the crystal; determining a lifter command signal to control a gap between a heat shield and a surface of a silicon melt from which the crystal is grown; and determining an adjustment to the gap, in response to a different pull-speed, using a Pv-Pi margin.

13 Claims, 13 Drawing Sheets

(56) References Cited

U.S. PATENT DOCUMENTS

| | | | |
|---|---|---|---|
| 2010/0024718 | A1 | 2/2010 | Orschel |
| 2010/0206219 | A1 | 8/2010 | Orschel |
| 2011/0259360 | A1 | 10/2011 | Marvin |
| 2012/0145068 | A1 | 6/2012 | Takanashi |
| 2018/0371639 | A1 | 12/2018 | Mueller |
| 2020/0224327 | A1 | 7/2020 | Kajiwara |

FOREIGN PATENT DOCUMENTS

| | | | |
|---|---|---|---|
| CN | 110573662 | A | 12/2019 |
| JP | 2010155726 | A | 7/2010 |
| JP | 2015107897 | A | 6/2015 |
| JP | 2018177593 | A | 11/2018 |
| JP | 2005015314 | | 1/2020 |
| JP | 6885301 | B2 | 6/2021 |
| TW | 201016904 | A | 5/2010 |

OTHER PUBLICATIONS

Japanese Notification of Reasons for Refusal issued Dec. 27, 2022, in corresponding Japanese Application No. 2021-153973, filed Sep. 22, 2021, 4 pages.

Hourai, M., et al., "Review and Comments for the Development of Point Defect Controlled CZ-Si Crystals and their Application for Future Power Devices." Phys. Status Solidi A, pp. 1800664 (1 of 14) through 1800664 (14 of 14), 2018.

Rozgonyi, G.A., "Control of Point Defects, Impurities, and Extended Defects in CZ Si: The Original/Ongoing Silicon Nanoscale Engineering Defect Science." Semiconductor Silicon 2002; PV 02-2, 2002, 14 pages.

Chinese First Office Action and Search Report issued May 12, 2023, in corresponding Chinese Patent Application No. 202111152966.3, filed Sep. 29, 2021, 24 pages.

German Office Action as mailed on Aug. 9, 2023, issued in corresponding German Application No. 102021210073.2, filed Sep. 13, 2021, 8 pages.

* cited by examiner

MARGIN PROFILE

METHOD AND APPARATUS FOR MANUFACTURING DEFECT-FREE MONOCRYSTALLINE SILICON CRYSTAL

CROSS-REFERENCE(S) TO RELATED APPLICATION(S)

This application is a continuation based on U.S. application Ser. No. 17/037,060, filed on Sep. 29, 2020, expressly incorporated herein for all purposes.

BACKGROUND

The Czochralski (CZ) process was developed to manufacture monocrystalline or single-crystal materials. One of the most important applications for the CZ process in the modern computing world is growing a monocrystalline silicon crystal, which is sliced into silicon wafers for fabrication of semiconductor circuits. Briefly described, the CZ process includes melting a charge of polycrystalline silicon in a quartz crucible, and rotationally pulling a crystal seed from the surface of the silicon melt. As the crystal seed is being pulled from the silicon melt, monocrystalline silicon extends from the crystal seed and forms a cylindrical crystal. The modern CZ process can produce silicon crystals having diameters of 450 mm or greater.

A typical silicon crystal 100, shown in FIG. 1, has a shoulder 102 which is formed at the start of the process and is connected to the crystal seed, a body 104 which can extend for up 2 meters or more in length, and the tail 106 that forms at the finish of the process. It is important to grow a crystal with a uniform diameter in the body for purposes of commercial application and production yield. It is well known by those skilled in the art that increasing the pull-speed of the crystal seed tends to reduce the diameter of a crystal, and it follows that decreasing the pull-speed tends to enlarge the diameter. However, a precision control of a diameter for a silicon crystal often requires a sophisticated feedback control system that involves factors in addition to the pull-speed.

SUMMARY

In one embodiment, a crystal puller apparatus comprises a pulling assembly to pull a crystal from a silicon melt at a pull speed; a crucible that contains the silicon melt; a heat shield above a surface of the silicon melt; a lifter to change a gap between the heat shield and the surface of the silicon melt; and one or more computing devices to determine an adjustment to the gap using a Pv-Pi margin, at a given length of the crystal, in response to a change in the pull speed.

In one embodiment, the Pv-Pi margin comprises a first boundary for a Pv region and a second boundary for a Pi region.

In one embodiment, the Pv-Pi margin further comprises a center margin at a halfway between the first boundary and the second boundary.

In one embodiment, the one or more computing devices determines the adjustment to the gap using the center margin.

In one embodiment, the pull speed corresponds to a crystal growth rate (v) of a Voronkov ratio (v/G) and the gap constitutes a temperature gradient value (G) of the Voronkov ratio (v/G).

In one embodiment, one or more of computing devices maintain the Voronkov ratio at a desired value by adjusting the gap in response to any change in the pull speed.

In one embodiment, a crystal puller apparatus comprises a pulling assembly to pull a crystal having a desired diameter from a silicon melt in accordance with a pull-speed profile which provides pull-speed values; a crucible that contains the silicon melt; a heat shield above a surface of the silicon melt; a lifter below the crucible that moves the crucible vertically to control a gap between the heat shield and the surface of the silicon melt in accordance with a gap profile which provides gap values; a measurement device to measure an actual diameter of the crystal ingot; and one or more computing devices that change a pull-speed value to provide a different pull speed to keep the actual diameter of the crystal ingot at the desired diameter, and, in response to the different pull-speed, further adjust a gap value to provide a gap adjustment using a Pv-Pi margin.

In one embodiment, the Pv-Pi margin comprises a first boundary for a Pv region and a second boundary for a Pi region.

In one embodiment, the Pv-Pi margin further comprises a center margin at a halfway between the first boundary and the second boundary.

In one embodiment, the one or more computing devices determines the gap adjustment using the center margin.

In one embodiment, each of the pull speed values of the pull-speed profile corresponds to a crystal growth rate (v) of a Voronkov ratio (v/G) and each of the gap values of the gap profile constitutes a temperature gradient value (G) of the Voronkov ratio (v/G).

In one embodiment, one or more of computing devices maintain the Voronkov ratio at a desired value by adjusting the gap value in response to any change in the pull-speed value.

In one embodiment, the one or more computing devices performs active temperature gradient control using the center margin, the pull-speed profile, and the gap profile.

In one embodiment, the active temperature gradient control determines the gap adjustment based on the different pull speed, and using the center margin, the pull-speed profile, and the gap profile.

In one embodiment, the lifter vertically moves the crucible.

In one embodiment, a computer-implemented method of growing a crystal, wherein the method comprises determining, by a computing device, a pull-speed command signal to control a diameter of the crystal; determining, by the computing device, a lifter command signal to control a gap between a heat shield and a surface of a silicon melt from which the crystal is grown; and determining, by the computing device, an adjustment to the gap, in response to a different pull-speed, using a Pv-Pi margin.

In one embodiment, a target gap is based on pre-determined functions of pull-speed versus gap at different crystal lengths, the pre-determined functions are within the Pv-Pi margin which defines a range of acceptable ratios of v/G for growing the crystal substantially without defects, wherein v is a pull speed of the crystal and G is a temperature gradient of a solid-liquid interface of the crystal.

In one embodiment, the lifter command signal is based on a comparison of a gap measurement to the target gap.

In one embodiment, the pull-speed command signal is based on a comparison of a measured diameter of the crystal and a diameter profile value which provides a pull-speed correction value, and the pull-speed command signal is based on a comparison of the pull-speed correction value to a pull-speed profile value.

In one embodiment, the diameter profile value is determined based on a function of crystal diameter versus crystal length, and the pull-speed profile is determined based on a function of pull-speed versus crystal length.

In one embodiment, the pull-speed command signal is used in calculating the target gap.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In this specification, referring to an "example" or to "an embodiment" or to "one embodiment" means that a particular feature, structure, or characteristic is included in at least one example or embodiment. Thus, the phrases "in one example" or "in an embodiment" or "in one embodiment" are not necessarily all referring to the same example or embodiment. Furthermore, the particular features, structures, or characteristics may be combined in any suitable manner in one or more examples or embodiments.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 3:
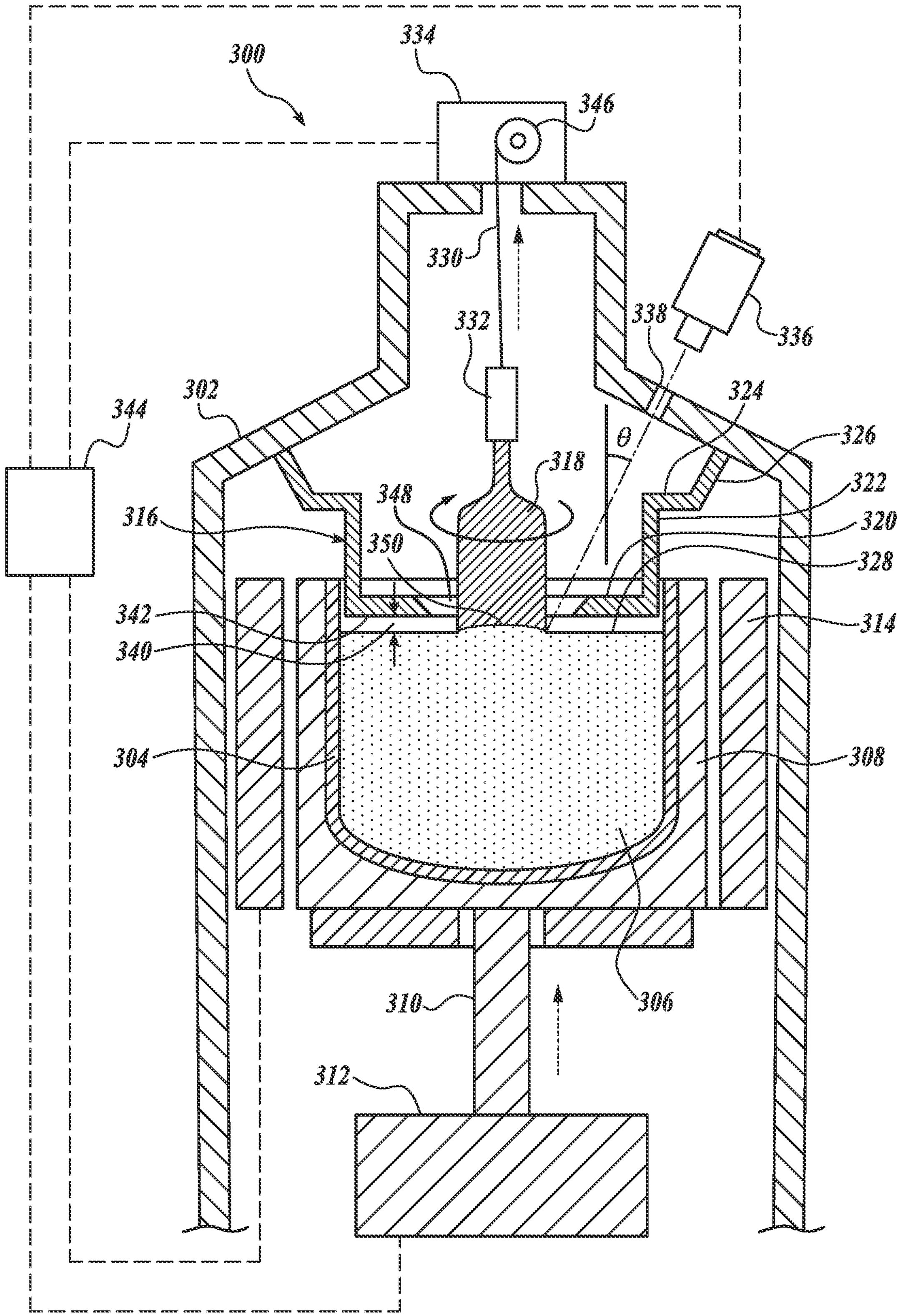
FIG. 3 is a schematic illustration of a crystal puller apparatus in accordance with an embodiment of the present disclosure.

Conventionally, the CZ process aims to maintain the diameter of the silicon crystal by adjusting the pull-speed and the temperature of the silicon melt in the crucible. However, it is well known that variations of the pull-speed that are performed to control the crystal diameter have a negative effect on a defect distribution within the crystal. It is also well known that pull-speed variations have a negative effect on morphological stability during the growth of heavily doped crystals. Voronkov pointed out that the grow-in defect distributions are a function of the ratio (v/G), called the Voronkov ratio, between the growth rate (or crystal pull rate), v, (mm/min) and the axial temperature gradient, G, (Celsius/mm) at the solid-liquid interface 350 (FIG. 3). See V. V. Voronkov, J. Crystal Growth, 1982, 59, 625.

Figure 2:
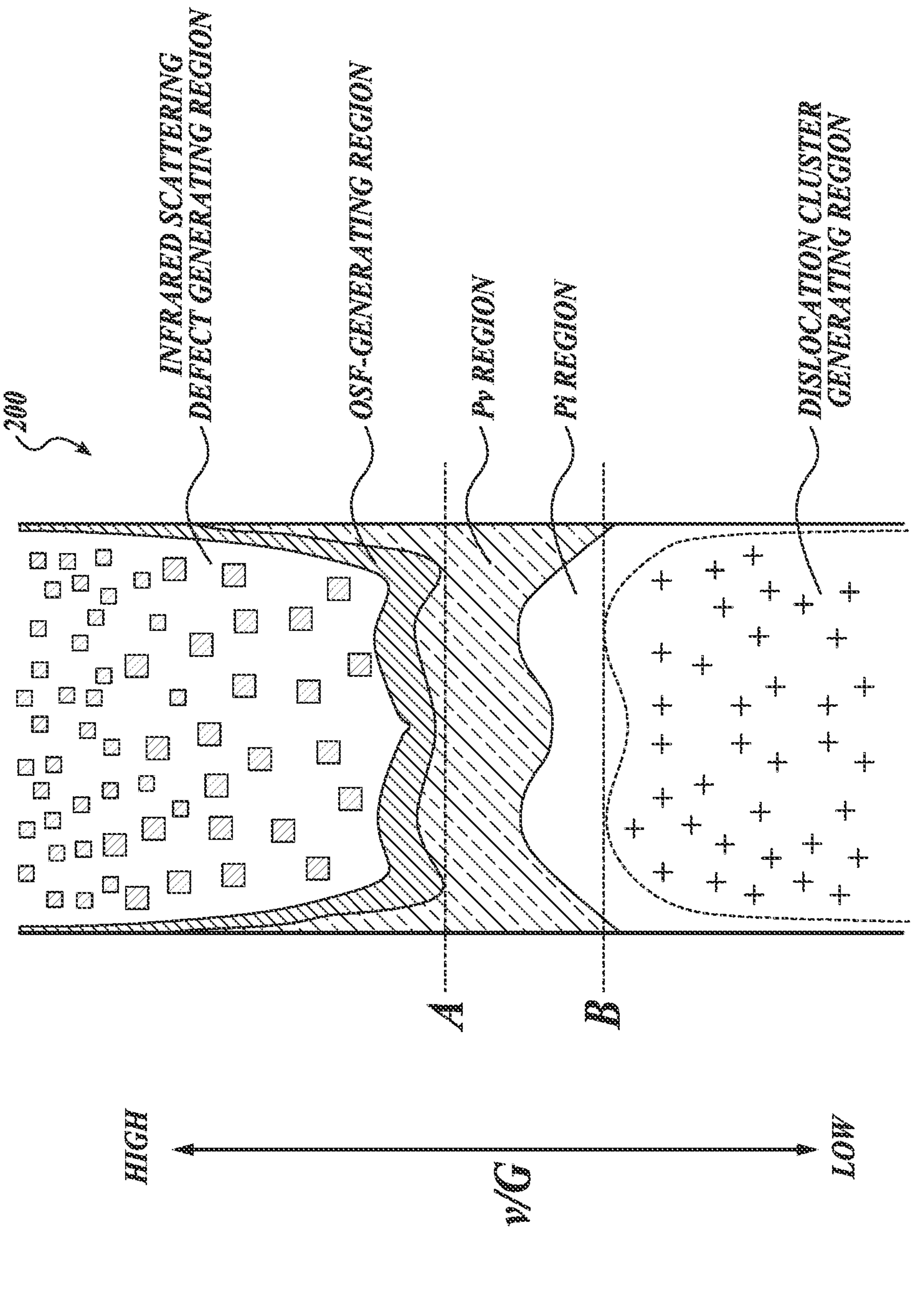
FIG. 2 is an illustration of defect regions and defect-free regions of a crystal as a function of the Voronkov ratio (v/G)

FIG. 2 is a vertical cross-section of a monocrystalline silicon crystal (hereinafter "crystal", "single crystal" "silicon crystal", "ingot" "crystal ingot" or "silicon ingot") 200 illustrating types of grow-in defects and their distributions. FIG. 2 illustrates the effects on crystal growth while gradually decreasing the pull-speed, v, thus, reducing the Voronkov ratio.

When the Voronkov ratio (v/G) is large, an agglomeration of vacancies (or vacancy defects), called COPs (Crystal Originated Particles), develops in the crystal. COPs are crystallographic defects which are lattice sites where silicon atoms would occupy in a perfect crystal but are missing. On the other hand, when the Voronkov ratio is small, dislocation clusters, called L/DLs (large dislocation loops), develop in the crystal. Dislocation clusters are an agglomeration of interstitial silicon that are excessively incorporated between crystal lattices. L/DLs also represent crystallographic defects caused by interstitial defects of silicon atoms that occupy sites in the crystal structure at which there is usually not an atom. Oxidation-induced stacking faults (OSFs) are detrimental recurrent defects that appear along the silicon crystal obtained by CZ method. COPs, L/DLs, and OSFs can degrade the performance of integrated semiconductor devices fabricated from wafers that are cut from such silicon crystals having defects.

On the other hand, the crystal 200 includes an oxygen precipitation promotion region, or an vacancy point-defect region, (Pv region) and an oxygen precipitation suppression region, or an interstitial point-defect region, (Pi region) between the OSF region and the L/DL region. COPs and L/DLs do not exist in the Pv and Pi regions. The Pv region is considered a defect-free region in which vacancy type point defects are dominant, and the Pi region is considered a defect-free region in which interstitial silicon type point defects are dominant. The point defects are considered non-defects because of their size and because they do not negatively affect performance of a device that is fabricated from a wafer that is cut from a silicon crystal. Thus, the key to manufacture a defect-free silicon crystal, and wafers therefrom, is to maintain the Voronkov ratio (v/G) within the Pv and Pi regions, called the Pv-Pi margin and depicted by the boundaries A and B in FIG. 2, while growing the silicon crystal.

Figure 1:
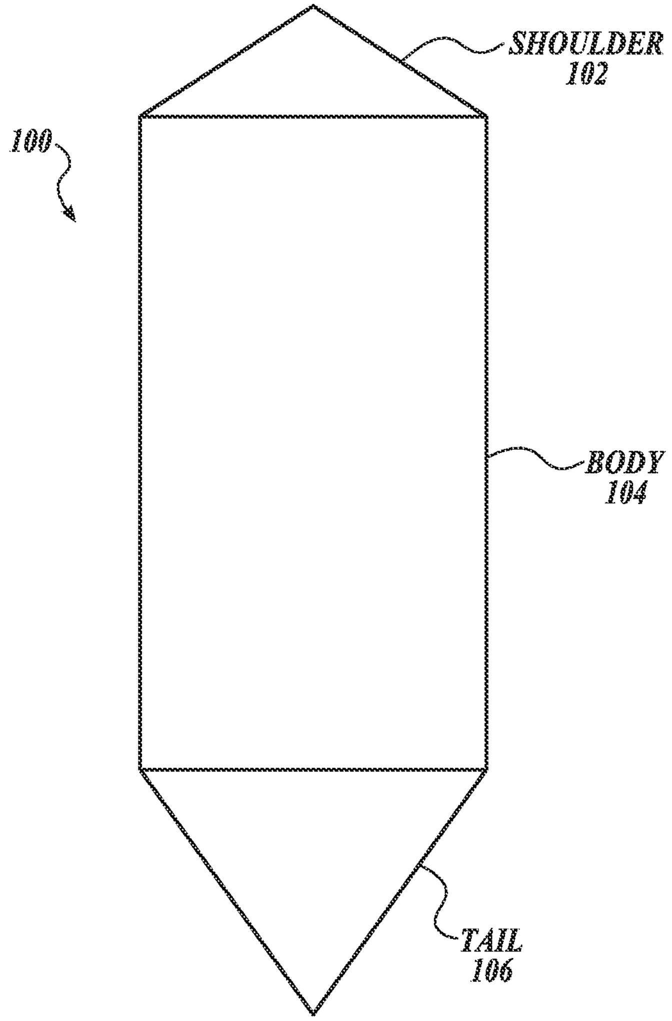
FIG. 1 is a representative shape of a crystal.

According to this disclosure, computer-implemented methods and the system provide a process of growing a crystal with a substantially constant diameter in the body (104, FIG. 1) by controlling the pull speed (v) and the temperature gradient (G) to keep the Voronkov ratio (v/G) within the Pv-Pi margin and thereby obtaining defect-free wafers.

According to embodiments of this disclosure, a heat shield above silicon melt is used to control the temperature gradient at the solid-liquid interface. In particular, the distance (i.e., gap, or gap distance) between the bottom of the heat shield and the silicon melt may be varied to control the amount of heat flow that affects the axial temperature gradient of the crystal at the solid-liquid interface. Therefore, throughout this disclosure, controlling gap constitutes controlling temperature gradient of the crystal at the solid-liquid interface.

I. Puller Apparatus

FIG. 3 shows a representative example of a crystal CZ puller apparatus 300 (or puller) that may be used to implement the systems and methods of the present disclosure. The illustrated puller 300 is a simplified schematic which omits illustrating some of the components of a conventional puller as their inclusion would only obscure some of the aspects of the disclosure and their omission does not prevent understanding. Pullers, in general, are used to grow silicon crystals by the Czochralski method.

In one embodiment, the puller 300 includes an exterior enclosure 302 which may be used to perform crystal growth in an inert atmosphere, such as argon. In one embodiment, the puller 300 includes a quartz crucible 304 to hold the silicon melt 306. In one embodiment, the quartz crucible 304 is a bowl-shaped container having an upright tubular wall with a closed bottom and an open top.

In one embodiment, the quartz crucible 304 is received within a carbon crucible 308. The carbon crucible, like the quartz crucible 304, has a tubular wall, a closed bottom and an open top. The carbon crucible 308 interior diameter is equal to or slightly larger than the outer diameter of the quartz crucible 304, and the closed bottom of the quartz crucible 304 rests on top of the closed bottom of the carbon crucible 308.

In one embodiment, the carbon crucible 308 rests on the end of a drive shaft 310. A lifter 312 drives the drive shaft 310 to rotate and move the carbon crucible 308 and by extension the quartz crucible 304 vertically. The lifter 312 can be comprised of an electric servo motor that has a shaft connected to a gear reducer which in turn is connected to the drive shaft 310. The electric motor can have a variable frequency drive to control the rate of lifting the carbon crucible 308 and for controlling the direction to either lift or lower the carbon crucible 308. In other embodiments, the lifter 312 can be configured differently to provide an alternative mechanism for lifting the quartz crucible.

The puller 300 includes a carbon heater 314 that surrounds the carbon crucible 308 and is used to provide heat to the quartz crucible 304 to control the temperature of the silicon melt 306 in the quartz crucible 304.

In one embodiment, a tubular radiation heat shield 316 is located above the silicon melt 306. In one embodiment, the heat shield 316 reduces the amount of heat reaching the crystal 318. In one embodiment, the heat shield 316 can be made of metal, graphite, ceramics or other materials, and the thickness can vary depending on the material.

In one embodiment, the heat shield 316 has a flat annular section 320 directly above and generally parallel to the silicon melt 306. The annular flat section 320 has an aperture 348 in the center to allow the crystal 318 to be pulled through the aperture 348. The outside diameter of the flat annular section 320 is connected to a tubular section 322 of constant diameter. The outside diameter of the tubular section 322 is smaller than the inside diameter of the quartz crucible 304, so that the entirety of the flat annular section 320 and a part of the tubular section 322 are within and below the upper edge of the top opening of the quartz crucible 304. The tubular section 322 ends at the top in a connection to a second annular section 324, wherein the tubular section 322 is connected to the inside diameter of the aperture in the second annular section 324. The outside diameter of the second annular section 324 is connected to a cone shaped section 326 which is ultimately fixed to the inside of the enclosure 302 of the puller 300. In other embodiments, the heat shield can be configured differently. In an embodiment, the heat shield 316 can be configured with a lifter to raise and lower the heat shield 316. A lifter for the heat shield can be an alternative to or in addition to the lifter 312 for the quartz crucible.

In one embodiment, the vertical distance (i.e., gap 340) between the bottom side 342 of the first annular section 320 of the heat shield 316 and the melt surface 328 may be adjusted by the lifter 312 through the vertical movement of the drive shaft 310 and carbon crucible 308. Bottom side 342 of the heat shield 316 is the side facing the melt surface 328. Such adjustment of the gap 340 changes the temperature gradient, G, at the solid-liquid interface 350 of the crystal 318 and is used according to this disclosure to control the Voronkov ratio within the Pv-Pi margin.

The puller 300 includes a pulling assembly 334 generally located on the top of the enclosure 302. The pulling assembly 334 comprises a servo motor 346 with pulley attached to a cable 330 that runs vertically down and is generally concentrically aligned with the center of the aperture 348 of the first annular section 320 of the heat shield 316. The lower end of the cable 330 is attached to a crystal seed 332. The pulling assembly 334 through the servo motor 346 pulls the crystal seed 332 vertically upward by means of the cable 330 from the silicon melt 306. FIG. 3 shows that a crystal 318 is grown from the end of the crystal seed 332 as the servo motor 346 pulls on the cable 330.

The puller 300 includes an optical device 336 (e.g., a CCD camera) that is used to measure the diameter of the crystal 318 through the window 338 of the outer enclosure 302. The optical device 336 may also be used to measure the gap 340 between the bottom side 342 of the heat shield 316 and the melt surface 328 of the silicon melt 306.

FIG. 3 shows a computing system 344 configured for process control of the CZ puller 300. The computing system 344 is electrically connected to send or receive control signals from, at least, the lifter 312, the pulling assembly 334, and the heater 314. The computing system 344 also receives measurement signals, at least, from the optical device 336, to measure the crystal 318 diameter and the gap 340. Other measurements may include one or more temperatures from one or more locations on the CZ puller 300. The process control loops are described further below.

II. Computing System

Figure 4:
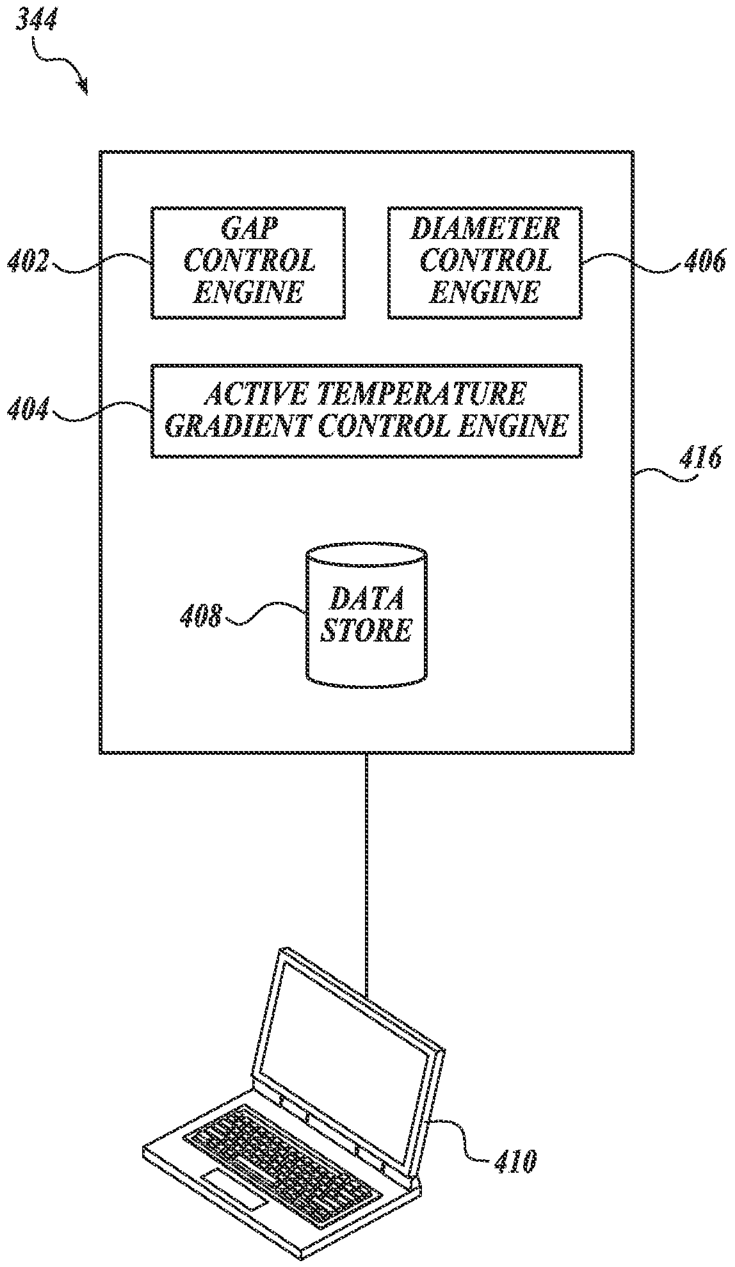
FIG. 4 is a schematic illustration of a computing device in accordance with an embodiment of the present disclosure.

FIG. 4 is a schematic illustration of the computing system 344. In one embodiment, the computing system 344 can be comprised of a central computing server or a personal computer or multiple computers 410 connected via a network, such as the Internet or Intranet or any local area network, that executes the software components illustrated in block 416. A computing device 410 includes one or more processors, non-transitory computer-readable media, and network communication interfaces that allow communication to each other and the central computing server in a distributed computing environment. The computing device 410 may also receive and transfer data through a transitory computer-readable media, such as a USB drive.

In one embodiment, the computing system 344 includes engines configured to perform computer-implemented methods or routines. "Engine" refers to logic embodied in hardware or software instructions, which can be written in a programming language, such as C, C++, COBOL, JAVA™, PHP, Perl, HTML, CSS, JavaScript, VBScript, ASPX, Microsoft .NET™, Go, and/or the like. An engine may be compiled into executable programs or written in interpreted programming languages. Software engines may be callable from other engines or from themselves. Generally, the engines described herein refer to logical modules that can be merged with other engines or can be divided into sub-engines. The engines can be stored in any type of computer-readable medium or computer storage device and be stored on and executed by one or more general purpose computers, thus creating a special purpose computer configured to provide the functionality of such engines.

In one embodiment, the computing system 344 is configured to perform at least a plurality of process control loops. For this purpose, the computing system 344 may include (a) a diameter control engine 406 configured to control the pull-speed of the crystal 318 based on the measured diameter, diameter profile, and speed profile, for producing the desired crystal diameter, (b) a gap control engine 402 configured to control the lifter 312 vertically based on the measured gap and a target gap value, and (c) an active temperature gradient control engine (AGC) 404 which computes the target gap value based on the pull-speed command signal, pull-speed profile, gap profile, and margin profile, for achieving desirable temperature gradient value (G) in response to any changes in the crystal pull speed (v) so that the v/G ratio is kept within the Pv-Pi margin. Note that the underlying function of an active temperature gradient control as described in other embodiments and that of an active temperature gradient control engine (AGC) 404 in this embodiment is the same.

"Data store" refers to any suitable device configured to store data for access by a computing device or engine. One example of a data store is a highly reliable, high-speed relational database management system (DBMS) executing on one or more computing devices and accessible over a high-speed network. Another example of a data store is a key-value store. However, any other suitable storage technique and/or device capable of quickly and reliably providing the stored data in response to queries may be used, and the computing device may be accessible locally instead of over a network, or may be provided as a cloud-based service. A data store may also include data stored in an organized manner on a computer-readable storage medium, such as a hard disk drive, a flash memory, RAM, ROM, or any other type of computer-readable storage medium. One of ordinary skill in the art will recognize that separate data stores described herein may be combined into a single data store, and/or a single data store described herein may be separated into multiple data stores, without departing from the scope of the present disclosure.

In one embodiment, the data store 408 is used to store profiles containing the values to be used for, at least, the gap control engine 402, the diameter control engine 406, and the AGC 404. In one embodiment, profiles can mean a function, tables, or a relationship of one variable to one or more variables, and the like. For example, functions of pull-speed versus crystal length, diameter versus crystal length, gap versus crystal length, and pull-speed versus gap may be pre-determined through experimental and/or theoretical methods and stored in the data store 408.

Figure 5:
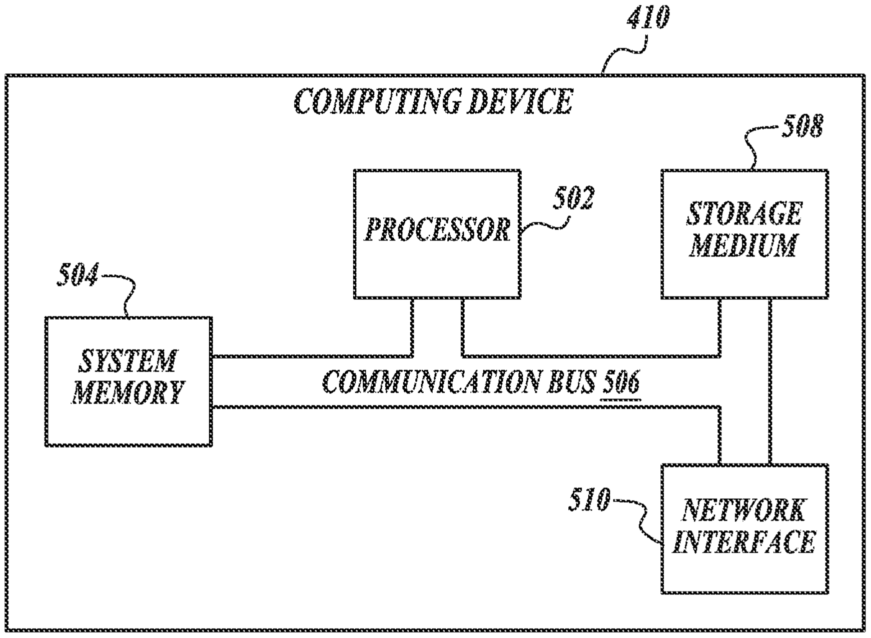
FIG. 5 is a schematic illustration of a computing device in accordance with an embodiment of the present disclosure.

FIG. 5 is a block diagram that illustrates aspects of an exemplary computing device 410.

In their most basic configuration, the computing device 410 includes at least one processor 502 and a system memory 504 connected by a communication bus 506. Depending on the exact configuration and type of computing device, the system memory 504 may be volatile or nonvolatile memory, such as read only memory ("ROM"), dynamic random access memory ("DRAM"), EEPROM, flash memory, or similar memory technology. Those of ordinary skill in the art and others will recognize that system memory 504 typically stores data and/or program modules that are immediately accessible to and/or currently being operated on by the processor 502. The processor 502 serves as a computational center of the computing device 410 by supporting the execution of instructions.

As further illustrated in FIG. 5, the computing device 410 may include a network interface 510 comprising one or more components for communicating with other devices over a network. Embodiments of the present disclosure may access basic services that utilize the network interface 510 to perform communications using common network protocols. The network interface 510 may also include a wireless network interface configured to communicate via one or more wireless communication protocols, such as WiFi, 2G, 3G, LTE, WiMAX, Bluetooth, Bluetooth low energy, and/or the like. As will be appreciated by one of ordinary skill in the art, the network interface 510 illustrated in FIG. 5 may represent one or more wireless interfaces or physical communication interfaces described and illustrated above with respect to particular components of the computing device 410.

In the exemplary embodiment depicted in FIG. 5, the computing device 410 also includes a storage medium 508. However, services may be accessed using a computing device that does not include means for persisting data to a local storage medium. Therefore, the storage medium 508 depicted in FIG. 5 may be optional. In any event, the storage medium 508 may be volatile or nonvolatile, removable or nonremovable, implemented using any technology capable of storing information such as, but not limited to, a hard drive, solid state drive, CD ROM, DVD, or other disk storage, magnetic cassettes, magnetic tape, magnetic disk storage, and/or the like.

As used herein, the term "computer-readable medium" includes volatile and non-volatile and removable and non-removable media implemented in any method or technology capable of storing information, such as computer readable instructions, data structures, program modules, or other data. In this regard, the system memory 504 and storage medium 508 depicted in FIG. 5 are merely examples of computer-readable media.

Suitable implementations of computing devices 410 that include a processor 502, system memory 504, communication bus 506, storage medium 508, and network interface 510 are known and commercially available. For ease of illustration and because it is not important for an understanding of the claimed subject matter, FIG. 5 does not show some of the typical components of many computing devices. In this regard, the computing device 410 may include input devices, such as the illustrated keyboard, and may also include a keypad, mouse, microphone, touch input device, touch screen, tablet, and/or the like. Such input devices may be coupled to the computing devices by wired or wireless connections including RF, infrared, serial, parallel, Bluetooth, Bluetooth low energy, USB, or other suitable connections protocols using wireless or physical connections. Similarly, the computing device 410 may also include output devices such as the illustrated display, and may also include speakers, printer, etc.

III. Crystal Diameter, Crystal Length, and Gap Distance Measurements

In one embodiment, as shown in FIG. 4, the diameter control engine 406 uses a measurement of the crystal 318 diameter at about the solid-liquid interface 350, and the gap control engine 402 uses a measurement of the gap 340 between the top of the melt surface 328 and the bottom side 342 of the heat shield 316.

In one embodiment, the optical device 336 can be used for both the measurement of the crystal diameter and the gap distance. In one embodiment, the crystal diameter is measured according to a technique known from U.S. Pat. No. 8,414,701. In one embodiment, the gap distance is measured according to a technique known from U.S. Pat. No. 9,567,692. None of the measurement techniques need to be explained in detail for understanding the systems and methods of the present disclosure, as reference can be made to the foregoing patents.

Embodiments of process control in this disclosure may use a measured value of the current crystal 318 length to determine values from a diameter profile, pull-speed profile, gap profile, and margin profile. In one embodiment, crystal length means the length from the peak of the shoulder 102 (FIG. 1) to the solid-liquid interface 350. In one embodiment, the crystal 318 length is determined by an encoder that counts the rotations of the motor of the servo motor 346, for example. The encoder can then translate the number of rotations into a corresponding length of the crystal 318. In one embodiment, the length of the crystal 318 is determined based on the weight and the density and geometry or shape of the crystal 318. In one embodiment, the length of the crystal 318 can be directly measured by an optical device such as the optical device 336.

IV. Process Control Model

Figure 6:
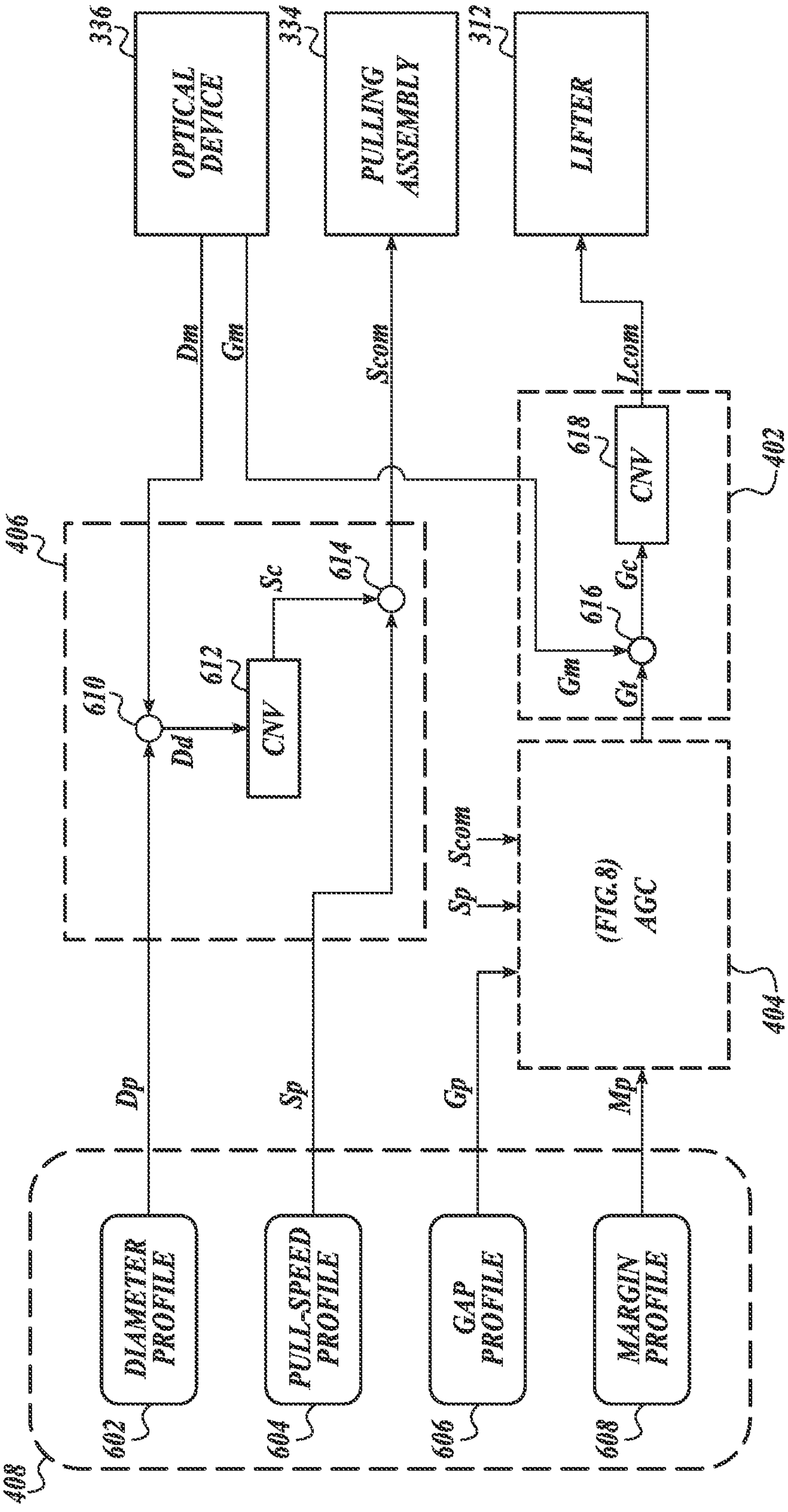
FIG. 6 is a process control loop diagram in accordance with an embodiment of the present disclosure.

FIG. 6 shows an embodiment of process control loops for the CZ puller 300. A process control loop can use measured variables, input setpoint variables from profiles, and then manipulate variables to give the desired process output. Process disturbances, such as inaccuracies in the actual speed of the seed crystal 332 can affect the process output. In one embodiment, the present disclosure addresses process disturbances by controlling the v/G ratio within the Pv-Pi margin to minimize defects in the crystal due to variations in actual speed, for example.

In FIG. 6, the measured variables from the optical device 336 include the crystal diameter measurement (Dm) and the gap measurement (Gm). It is understood that the crystal length is also measured or calculated through indirect means. The command variables include the pull-speed command signal (Scom) to the pulling assembly 334 which affects the diameter of the crystal 318, and the lift command signal (Lcom) to the lifter 312 which changes the gap 340 between the melt surface 328 and the heat shield 316. The pull-speed command signal (Scom) is the output from the diameter control engine 406 and the lift command signal (Lcom) is the result of the AGC 404 and gap control engine 402. Herein, a command signal represents the target output desired of the controlled device. A command signal can be representative of numerical values, such as mm/min. In a physical sense, a command signal can be, for example, an electrical signal that varies in voltage or a pneumatic signal.

In one embodiment, the gap control engine 402 is in cascade control with the AGC 404, while the AGC 404 is in cascade control with the diameter control engine 406. In other words, the output from the diameter control engine 406 is used in the AGC 404, and the output from the AGC is used in the gap control engine 402. The AGC 404 and the gap control engine 402 makes an adjustment to the gap 340. Herein, command signals (Scom and Lcom) represent the desired output of the controlled devices including the pulling assembly 334 and lifter 312, respectively.

The process control loops, i.e., engines, also use predetermined input values from the diameter profile 602, pull-speed profile 604, gap profile 606, and margin profile 608. From the two measured variables (Dm, Gm), the crystal length, and two command variables (Scom, Lcom) and the predetermined profiles, the process output is a defect free crystal of a pre-determined diameter. Particularly, the Voronkov ratio (v/G) is maintained within the Pv-Pi margin by the AGC 404 providing a target gap (Gt) to the gap control engine 402.

In FIG. 6, the relation between the diameter control engine 406, the gap control engine 402 and the AGC 404 is illustrated. The optical device 336 measures the actual diameter (Dm) of the crystal in real time and feeds that information to the diameter control engine 406. The diameter control engine 406 then calculates a diameter difference (Dd) at block 610 by comparing the measured diameter (Dm) to the diameter value taken from the diameter profile 602 at the current length of the crystal 318. Based on Dd, the diameter control engine 406 determines a pull-speed correction (Sc) at 612. For example, if the diameter difference (Dd) indicates that the actual diameter of the crystal 318 is smaller than desired, then, the pull-speed correction (Sc) decreases. Conversely, if the diameter difference (Dd) indicates that the actual diameter of the crystal is larger than desired, then, the pull-speed correction (Sc) increases.

At block 612, a conversion is performed to convert Dd in millimeters, for example, into Sc in millimeters per minute. At block 614, the diameter control engine 406 then compares Sc with a pull-speed input or the value from the pull-speed profile (Sp) based on the current crystal diameter to determine a vertical pull-speed command signal (Scom) and sends Scom to the pulling assembly 334. However, because of Scom, the actual pull-speed that the crystal 318 experiences not only affects the diameter, but may also cause disturbances in the Voronkov ratio, v/G and form defects outside the Pv-Pi margin. Therefore, to avoid defects, an embodiment of the present disclosure may use Scom from the diameter control engine 406 to trigger the AGC 404 which determines the target gap (Gt). More about the operations of AGC 404 will be discussed in Section 5.

The gap control engine 402 then calculates a lifter command signal (Lcom) and sends Lcom to the lifter 312 to move the crucible 304 vertically to control the gap 340 between the melt surface 328 and the bottom side 342 of the heat shield 316. The gap 340 affects the temperature gradient, G, at the solid-melt interface 350. The gap 340, therefore, also affects the defect formation in the crystal. In the present disclosure, the combined control of pull-speed and gap is used to reduce and/or eliminate defects in the crystal. According to this disclosure, an AGC 404 calculates a target gap (Gt) to maintain v/G within the Pv-Pi margin when pull-speed changes.

As shown in FIG. 6, the data store 408 can include the data profiles including the diameter profile 602, pull-speed profile 604, gap profile 606, and margin profile 608. Profiles can be set up to be functions, correlations, or relationships, for example, pull-speed versus crystal length, diameter versus crystal length, gap versus crystal length, and pull-speed versus gap may be pre-determined through experimental or theoretical methods. Profiles can also be constructed as multi-dimensional arrays that have correlations for more than two variables. Profiles may vary based on different sizes of the crystal and further by different pullers.

In one embodiment, the diameter profile 602 provides a set of desired diameter values for the length of the crystal (i.e., as a function of the crystal length). The pull-speed profile 604 provides a set of desired pull-speed values also for the length of the crystal. The gap profile 606 provides a set of desired gap values for the length of the crystal. In general, both the diameter profile 602 and pull-speed profile 604 support the shape shown in FIG. 1. In one embodiment, values may include variations to account for heat transfer, pressure and other chemical and physics of the puller environment, such variations as obtained from simulations and/or test crystal growths.

The margin profile 608 provides the Pv-Pi margin at each given length of the crystal. The Pv-Pi margin includes (or may be used to compute) the center margin (MC) that is represented as a set of pull-speed values and corresponding gap values that are selected to maintain the Voronkov ratio, v/G, within the Pv-Pi margin. In one embodiment, these values are selected through simulations and/or test growths of crystals. In the test growths, various segments of the crystal are analyzed, and determination is performed to identify the pull-speed and thermodynamic terms that provide defect-free crystal zones (i.e., Pv-Pi margin). Such data may be compiled and tabulated at various lengths of the crystal. Such (tabulated) margin profile 608 may be used as a look-up table in the AGC 404 to determine the desired target gap used by the gap control engine 402.

Figure 7:
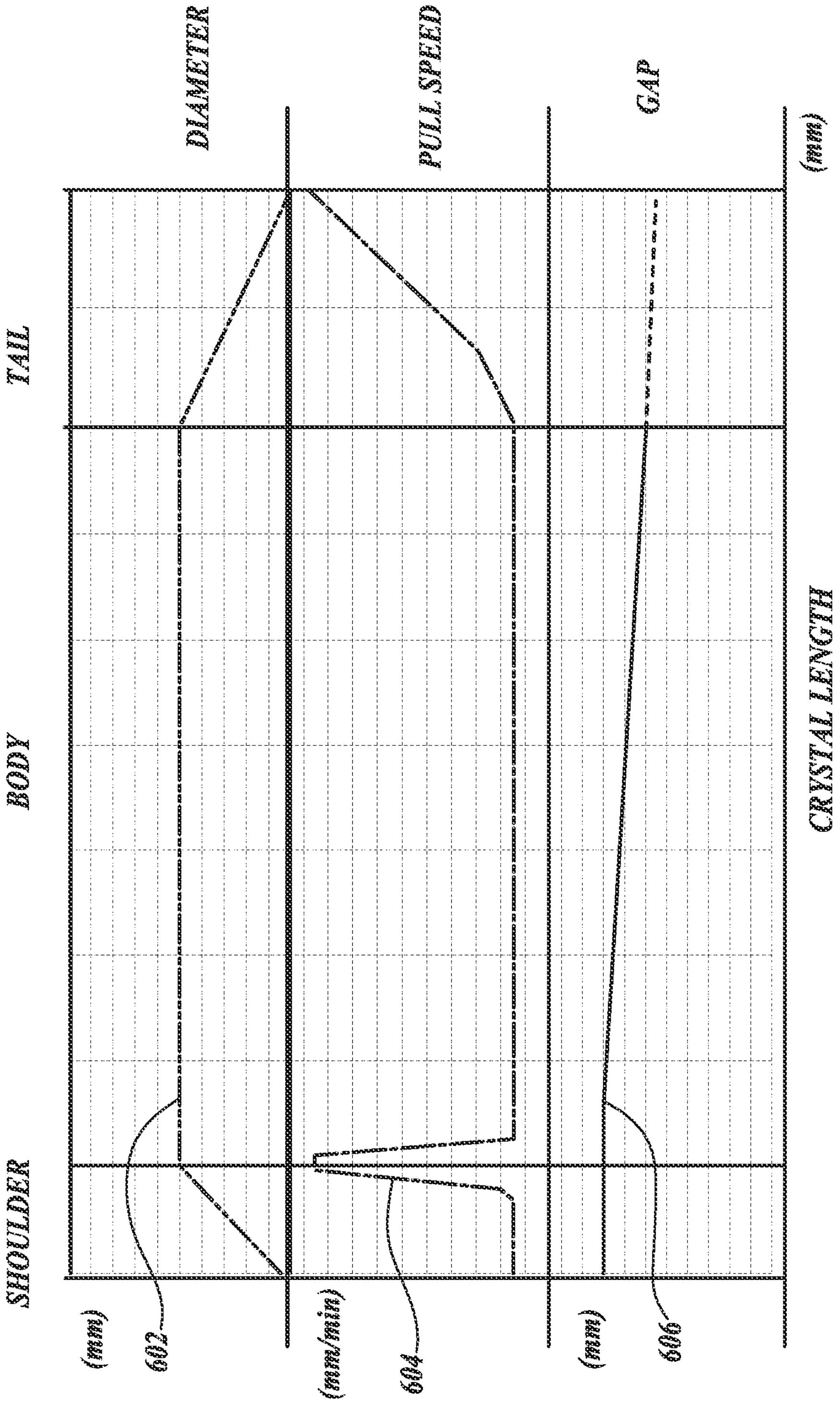
FIG. 7 is a graph illustrating various profiles as a function of crystal length in accordance with an embodiment of the present disclosure.

FIG. 7 shows graphs of one embodiment of the diameter profile values, the pull-speed profile values and the gap profile values over the length of a silicon crystal according to the present disclosure. In one embodiment, the diameter profile values, the pull-speed profile values and the gap profile values may be determined through simulations, a crystal growth learning trial, or constitute the average of historical data from multiple trials for a crystal of similar diameter and length. In another embodiment, the averaged historical data provide starting conditions which then allow additional fine tuning and selection for more optimized values.

FIG. 6 illustrates how the diameter control engine 406 performs diameter control dynamically over the length of the crystal. At adder 610, the diameter control engine 406 compares a value from the diameter profile (Dp) with a diameter measurement value (Dm) from the optical device 336 to compute any diameter difference (Dd). The diameter control engine 406 processes Dd, in the unit of millimeters, for example, through a converter 612 and determines a corresponding pull-speed correction (Sc), in the unit of millimeters per minute, for example, needed to change the crystal diameter into a pull-speed value that satisfies Dd. In one embodiment, the conversion from diameter to speed may be pre-determined and compiled in a table-lookup. At adder 614, the diameter control engine 406 further compares Sc to a value from the pull-speed profile (Sp) at the given length of the crystal, to compute a pull-speed command signal (Scom). The diameter control engine 406 then sends the pull-speed command signal to the pulling assembly 334, specifically the servo motor that executes the pull-speed command signal (Scom) which results in maintaining the silicon crystal at a desired diameter.

In one embodiment of the diameter control engine 406, instead of using the diameter profile values, the input desired diameter may be set to a single constant value.

The process control loop uses the AGC 404 to prevent defect formation in the crystal 318. The AGC 404 calculates a target gap (Gt) in response to the pull-speed command signal (i.e., Scom) required by the diameter control engine 406. As shown in FIG. 6, the AGC 404 outputs the target gap (Gt) based on the margin profile (Mp), gap profile (Gp), pull-speed profile (Sp), and the pull-speed command (Scom).

The gap control engine 402 uses the target gap (Gt) to determine a lifter command signal Lcom. At adder 616, the gap control engine 402 compares the target gap (Gt) with the gap measurement (Gm) to generate a gap correction (Gc). The converter 618 converts the gap correction (Gc) in millimeters to a dynamic displacement amount for the lifter, such as millimeters per minute. Such dynamic displacement amount represents a lifter command signal (Lcom) that moves the lifter 312 vertically to cause changes in the gap 340.

V. Active Temperature Gradient Control Engine

Figure 8:
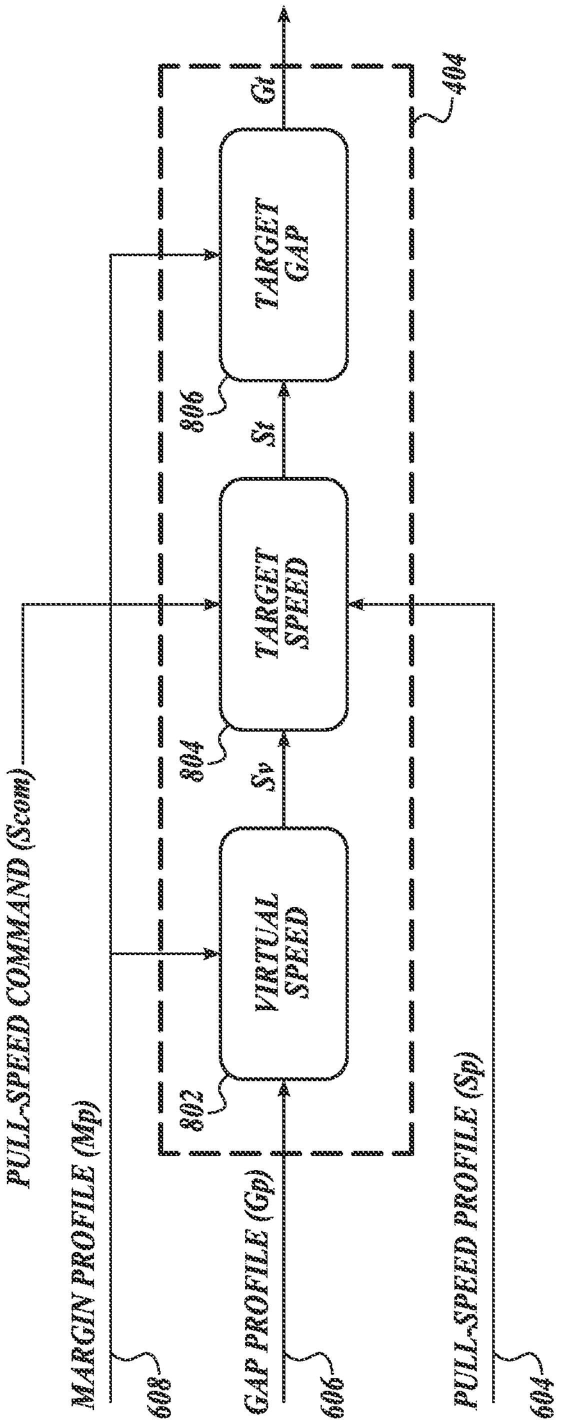
FIG. 8 is a diagram of an active temperature gradient control loop in accordance with an embodiment of the present disclosure.

FIG. 8 shows one embodiment of the AGC 404 according to the present disclosure. The AGC 404 includes a virtual speed block 802 that uses values from the margin profile (Mp) 608 and gap profile (Gp) 606.

Figure 9:
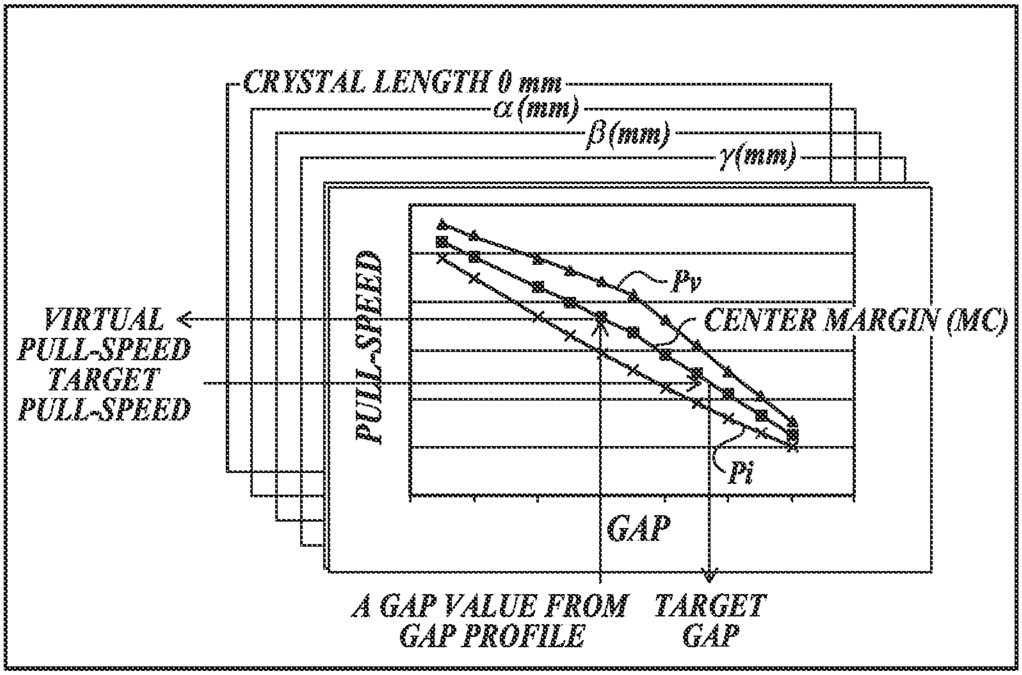
FIG. 9 is a graph illustrating a center margin profile as a function of pull-speed and gap, an upper and lower limit ranges as a function of pull-speed and gap defining acceptable ranges of the Pv-Pi margin.

FIG. 9 illustrates one embodiment of Mp according to the present disclosure. At given crystal lengths, Mp includes the Pv-Pi margin which further includes the center margin (MC) that is chosen at halfway within the Pv-Pi margin. The Pv-Pi margin provides the boundary for vacancy point-defect region (Pv region) and another boundary for interstitial point-defect region (Pi region), i.e., the boundary lines shown by A-B in FIG. 2. In FIG. 9, the Pv-Pi margin defines the defect-free area at each of various segments of the crystal. The Mp values may be stored in a three-dimensional array represented by a plurality of tables (or other data construct, such as graphs, formulas, etc.). These values may be obtained through simulation and/or empirical studies of silicon crystal and their growth parameters. In one embodiment, as shown in FIG. 9, the center margin (MC) is chosen at halfway within the Pv-Pi margin (or halfway between the Pv and Pi boundaries). Such choice allows equally sufficient margin in either boundary direction of the Pv-Pi margin. In another embodiment, a different value, biased more toward either Pv region or Pi region, may be used.

Returning to FIG. 8, in one embodiment, the virtual speed block 802 identifies the pull-speed value (virtual pull speed (Sv)) from the center margin (MC) that corresponds to the current gap value in the gap profile (Gp) 606. The virtual speed block 802 performs this task first by retrieving the gap value from the gap profile (Gp) 606 for the given crystal length. The virtual speed block 802 then refers to the center margin (MC) in the margin profile 608 to determine (i.e., to look-up) the virtual pull speed (Sv) that corresponds to the current gap value of the gap profile (Gp). Ideally, Sv and the corresponding Gp value provide the Voronkov ratio, v/G, in the defect-free zone or in the Pv-Pi margin. Such Sv is then used to determine the target pull-speed (St) as follows.

The target speed block 804 computes the target pull-speed (St) based on the pull-speed command signal (Scom), virtual pull speed (Sv) and the pull-speed profile (Sp) at the given crystal length according to the relationship: St=Sv*Scom/Sp, where St represents an estimate of the pull-speed resulting from the pull-speed command signal (Scom). The relationship can also be seen from FIG. 9. Here, if Scom=Sp, then the ratio, Scom/Sp, is 1, and the target pull-speed, St, is simply equal to Sv. The ratio (Scom/Sp) is a percent increase or decrease on the pull-speed (Y) axis of the center margin (MC) curve with respect to Sv.

Then, the target gap block 806 determines the target gap (Gt) by referring to the center margin in the margin profile 608 to look-up the gap value corresponding to the target pull-speed (St). The target gap (Gt) is then used by the gap control engine 402 to calculate a gap correction (Gc) as explained above.

Figure 10:
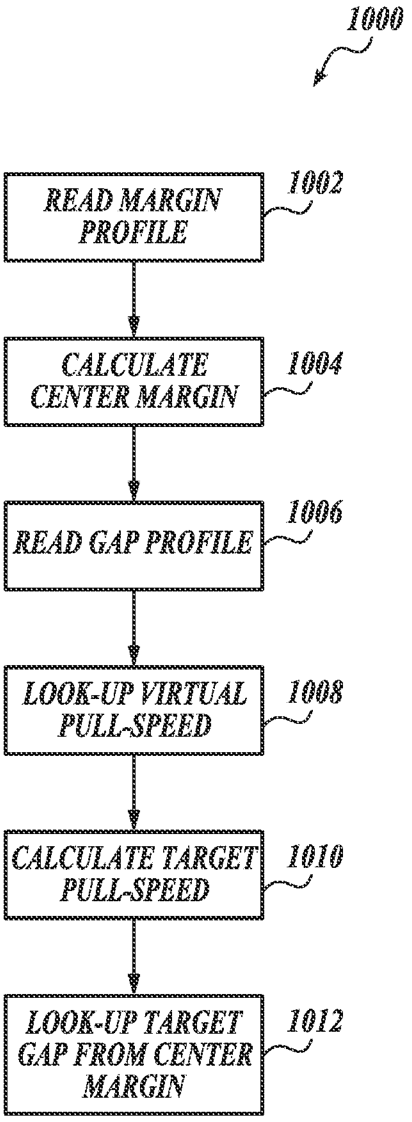
FIG. 10 is a flow diagram of a computer-implemented method for determining a target gap between heat shield and a solid-liquid interface.

FIG. 10 is a flow chart showing the process 1000 of the AGC 404 according to another embodiment of the present disclosure. At step 1002, the virtual speed block 802 reads in the margin profile (Mp) which includes the Pv-Pi margin. At step 1004, the virtual speed block 802 computes the center margin (MC) based on the Pv-Pi margin at a given crystal length. At step 1006, the virtual speed block 802 reads in a gap value from the gap profile (Gp) and, at step 1008, the virtual speed block 802 looks-up the corresponding virtual pull-speed (Sv) from the center margin (MC). At step 1010, the target speed block 804 computes the target pull-speed (St) that is an estimate of the pull-speed resulting from the pull-speed command signal (Scom) by taking the ratio of Scom to a pull-speed value from the pull-speed profile (Sp) as follows: St=Sv*Scom/Sp.

At step 1012, the target gap block 806 uses the target pull-speed (St) to look-up the target gap value (Gt) from the center margin (MC) that corresponds to the target pull-speed (St).

VI. Simulation Results

FIGS. 11A to 11E illustrate invention examples, aided by simulations, of the AGC 404 according to the present disclosure.

Figure 11A:
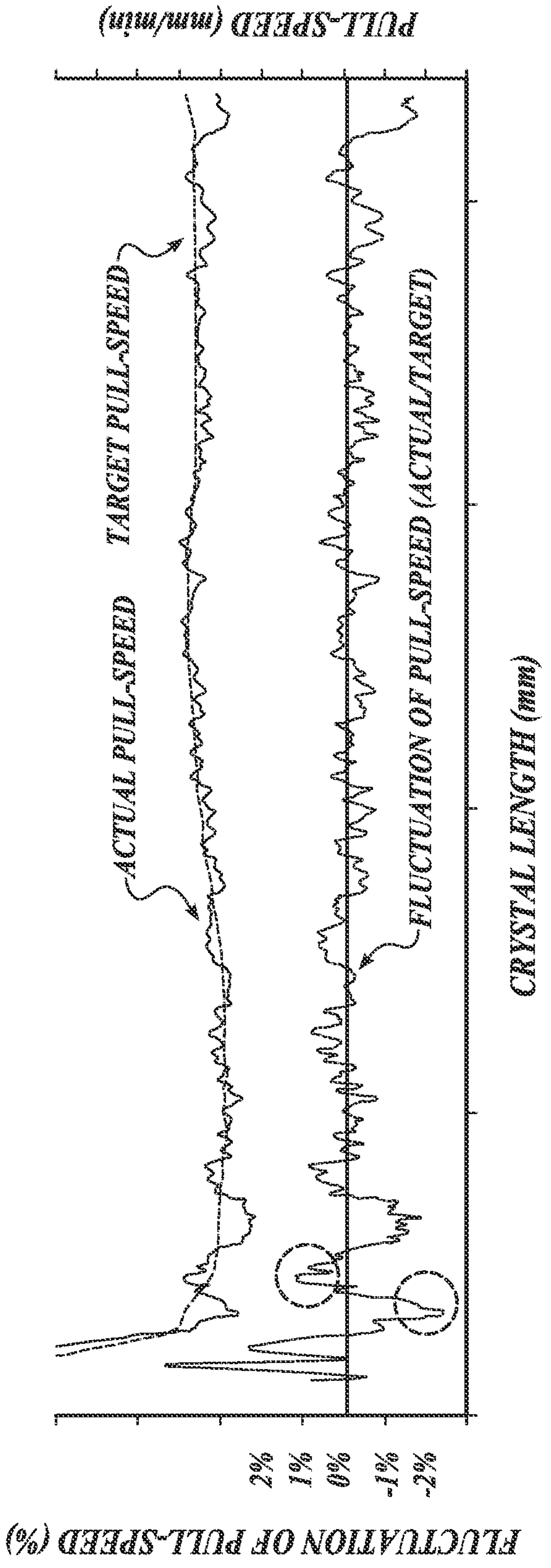
FIG. 11A is a representative graph showing the fluctuations of actual pull-speed compared to the speed command signal.

The top of FIG. 11A plots actual pull-speeds (measurements) over the pull-speed profile (i.e., system input). This shows that the actual pull-speeds fluctuate from the profile pull-speeds at the input during crystal growth. The bottom of FIG. 10A shows the ratio of the actual pull-speeds to profile pull-speeds to illustrate the degree or the sensitivity of the pull-speed changes.

Generally, changes in the pull-speed required by the diameter control affect the Voronkov ratio (v/G) and may cause the crystal to form either the vacancy or the interstitial defects. To maintain v/G at a desired level when speed changes, the temperature gradient (G) also needs to change. The system and method according to the present disclosure varies the gap distance between the bottom side of the heat shield and the top of the silicon melt to effectuate changes in the temperature gradient and thereby keep the ratio, v/G, Pv-Pi margin (A-B) to reduce defects in the crystal.

FIGS. 11B to 11E illustrate using simulation that adjusting the gap 340, in response to pull-speed changes, maintains crystal growth within the defect-free zone (A-B).

Figures 11B, 11C, 11D, 11E:
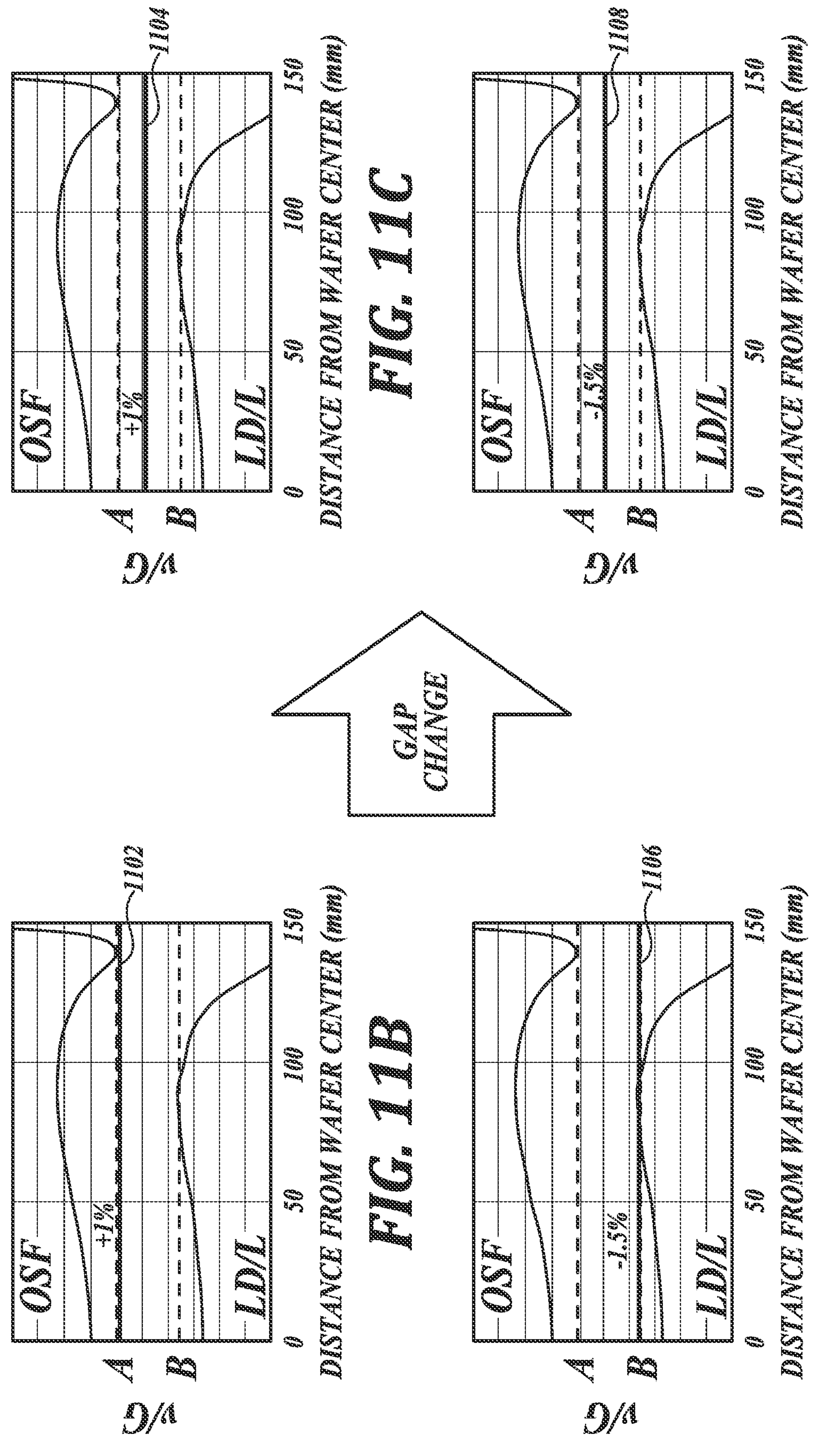
FIG. 11B is a representative graph showing the relationship of v/G as a function of the distance from a crystal center.
FIG. 11C is a representative graph showing the change in the relationship of FIG. 11B when the gap is changed.
FIG. 11D is a representative graph showing the relationship of v/G as a function of the distance from a crystal center.
FIG. 11E is a representative graph showing the change in the relationship of FIG. 11D when the gap is changed.

In FIG. 11B, an increase in pull-speed would increase the Voronkov ratio (v/G) and tend to cause the crystal growth (shown as line 1102) to enter the oxygen-induced stacking fault (OSF) region. To compensate this effect, a corresponding increase in temperature gradient (G) is required.

The AGC 404 would be used to reduce the gap 340 which reduces the amount of heat at the solid-liquid interface and increases G. As shown in FIG. 11C, changing gap in response to a change in pull-speed results in maintaining the Voronkov ratio (v/G) at a desired level and keeping the crystal growth line 1104 in the defect-free zone (A-B).

Similarly, in FIG. 11D, a decrease in pull-speed would cause the crystal growth line 1106 to enter the large dislocation (LD/L) region. To compensate this effect, the AGC 404 would increase the gap allowing more heat to reach the solid-melt interface and decreases G. As shown in FIG. 11E, such correction in gap would again maintain v/G at a desired level to keep the crystal growth line 1108 in the defect-free zone (A-B).

VII. Comparison

Figure 12:
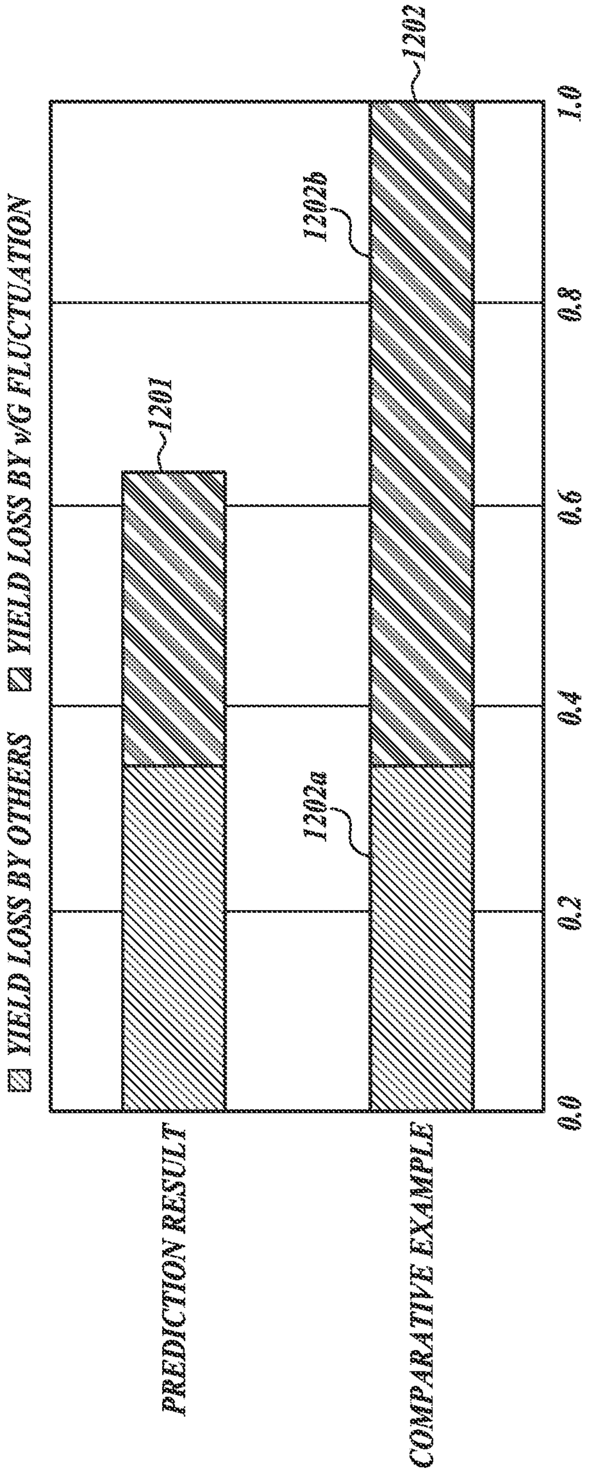
FIG. 12 shows a comparison of yield loss between a simulation result of an embodiment of the invention and a comparative example.

FIG. 12 illustrates a normalized comparison of a system with and without the use of the active temperature gradient control engine (AGC) 404 of the present invention. Here the lower bar 1202 represents the total wafer loss in a crystal normalized as 1 or 100% from the system without the use of AGC 404 of the present invention. About 66% of such loss is attributed to the disturbances or the fluctuations in the Voronkov ratio, v/G, 1202*b*. Other factors 1202*a*, including measurement errors, contribute to the remaining 34% of the loss. The upper bar 1201 shows a simulated result of the wafer loss from the same system that uses the AGC 404 of the present invention. Bar 1201 shows a significant decrease in the wafer loss by about 37% overall, all from the reduction in wafer loss due to the v/G fluctuations. Here the difference is from 66% to 29%, a net reduction of 37%, and an improvement of 54% in wafer yield from the use of AGC 404 of the present invention.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method of growing a silicon crystal, comprising:
- preparing a silicon melt in a crucible, wherein a gap exists between a surface of the silicon melt and a heat shield above the surface of the silicon melt;
- rotationally pulling the silicon crystal from the silicon melt at a pull speed, the silicon crystal having a diameter;
- accessing a margin profile, the margin profile including Pv-Pi margin data corresponding to each of various lengths of the silicon crystal; and
- determining adjustments to the gap using the Pv-Pi margin data in response to changes in the pull speed of the silicon crystal from the silicon melt, wherein each of the Pv-Pi margin data includes ranges of the gap versus the pull speed which define a defect-free region on the silicon crystal at a given crystal length.

2. The method of claim 1 wherein the Pv-Pi margin data comprises a first boundary for a Pv region and a second boundary for a Pi region.

3. The method of claim 2 wherein the Pv-Pi margin data further comprises a center margin at a halfway between the first boundary and the second boundary.

4. The method of claim 3 wherein the step of determining adjustments to the gap further includes determining adjustments to the gap using the center margin.

5. The method of claim 1 wherein the pull speed corresponds to a crystal growth rate (v) of a Voronkov ratio (v/G) and the gap constitutes a temperature gradient value (G) of the Voronkov ratio (v/G).

6. The method of claim 5 wherein the step of determining adjustments to the gap includes adjusting the gap in response to any change in the pull speed to maintain the Voronkov ratio at a desired value.

7. The method of claim 1, further comprising:
- rotationally pulling the silicon crystal at a desired diameter using a pull-speed profile that provides pull-speed values and a diameter profile that provides diameter values;

lifting the crucible vertically to control the gap using a gap profile that provides gap values; and changing one of the pull-speed values to provide a different pull speed to maintain an actual diameter of the silicon crystal at the desired diameter, and, in response to the different pull speed, further adjusting one of the gap values to provide a gap adjustment using the Pv-Pi margin data.

8. The method of claim 7 wherein the step of determining adjustments to the gap includes active temperature gradient control that determines a target gap in response to a change in pull speed using the Pv-Pi margin data, the pull-speed profile, and the gap profile.

9. The method of claim 8, wherein the target gap is determined from pre-determined functions of pull-speed versus gap at different crystal lengths, the pre-determined functions are within the Pv-Pi margin data which defines a range of acceptable ratios of v/G for growing the silicon crystal substantially without defects, wherein v is the pull speed of the silicon crystal and G is a temperature gradient of a solid-liquid interface of the silicon crystal.

10. The method of claim 8, further comprising:

determining a pull-speed command signal to control the diameter of the silicon crystal; and determining a lifter command signal to control the gap.

11. The method of claim 10, wherein the lifter command signal is determined by comparing a gap measurement to the target gap.

12. The method of claim 10, wherein the pull-speed command signal is determined by first comparing a measured diameter of the silicon crystal to a current diameter value from the diameter profile, which provides a pull-speed correction value, and second by comparing the pull-speed correction value to a current pull-speed value from the pull-speed profile.

13. The method of claim 7, wherein the diameter profile is determined based on a function of crystal diameter versus crystal length, and the pull-speed profile is determined based on a function of crystal pull speed versus crystal length.

* * * * *